United States Patent [19]

Gontowski, Jr.

[11] Patent Number: 4,598,259

[45] Date of Patent: Jul. 1, 1986

[54] STABLE FREQUENCY SAWTOOTH OSCILLATOR

[75] Inventor: Walter S. Gontowski, Jr., Thompson, Conn.

[73] Assignee: Sprague Electric Company, North Adams, Mass.

[21] Appl. No.: 678,330

[22] Filed: Dec. 5, 1984

[51] Int. Cl.⁴ .............................................. H03K 3/26
[52] U.S. Cl. ................................. 331/111; 307/228; 328/183
[58] Field of Search ............... 331/111, 143; 307/228; 328/181, 183

[56] References Cited

U.S. PATENT DOCUMENTS

| | | | |
|---|---|---|---|
| 3,679,989 | 7/1972 | Thibodeau | 330/185 |
| 4,415,869 | 11/1983 | Duijkers | 331/111 |
| 4,450,415 | 5/1984 | Gontowski, Jr. | 331/111 |
| 4,471,326 | 9/1984 | Steckler et al. | 331/111 |

Primary Examiner—James B. Mullins
Assistant Examiner—Robert J. Pascal

[57] ABSTRACT

A sawtooth-voltage-generating oscillator has a high gain comparator circuit formed of two differentially-connected NPN transistors driven respectively by two PNP transistors that leads to a very linear ramping of the sawtooth waveform, and at the same time, provides a sawtooth voltage swing at low supply voltages that may be within no more than 1.5 volts less than that low supply voltage. This oscillator also has the capability of working in the feed forward mode in a switching mode power supply while maintaining a stable oscillation frequency over a wide range of supply voltages.

8 Claims, 3 Drawing Figures

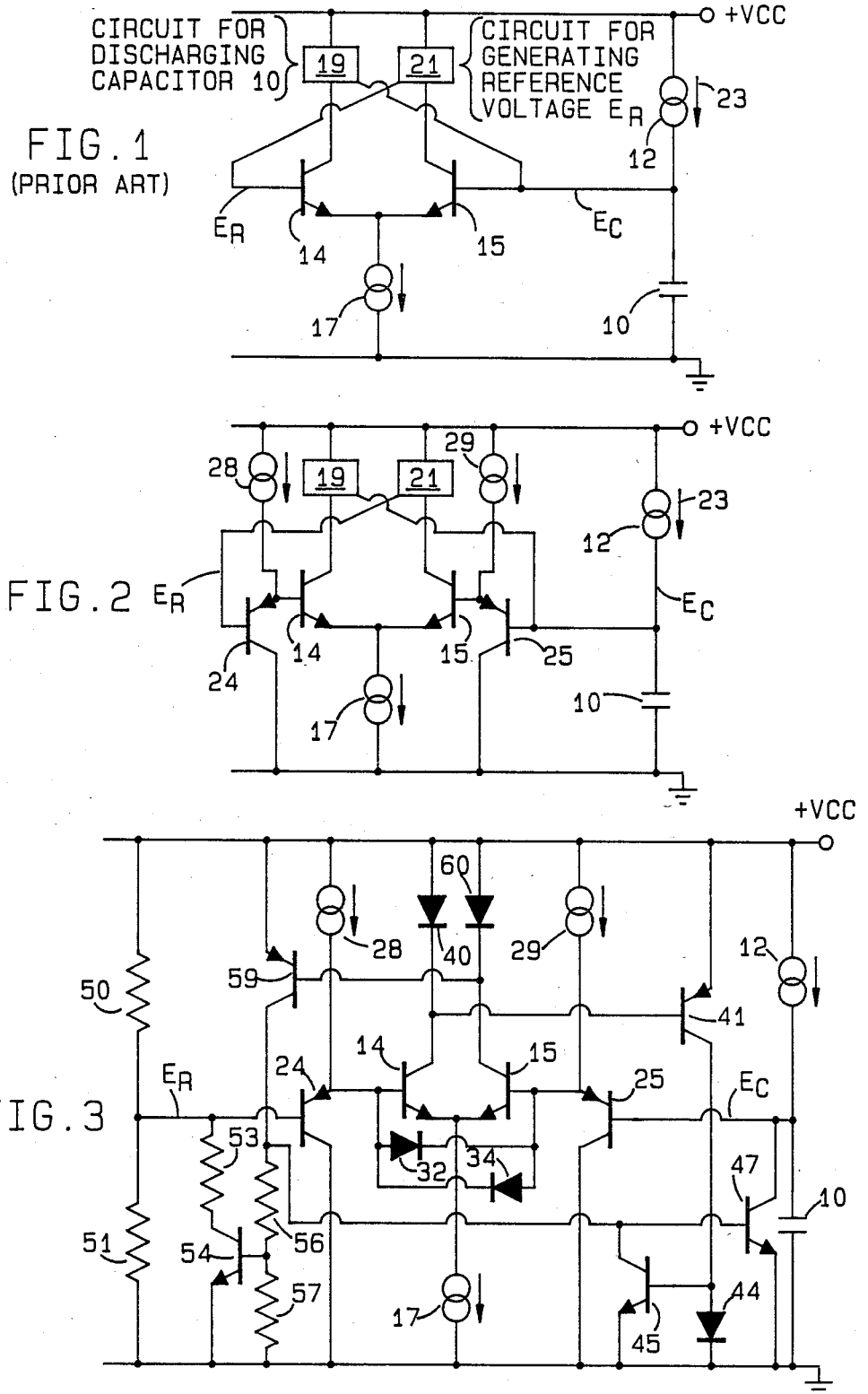

STABLE FREQUENCY SAWTOOTH OSCILLATOR

BACKGROUND OF THE INVENTION

This invention relates to an integrated-circuit relaxation oscillator and more particularly to such an oscillator that is capable of operating stably at one frequency while being powered from a widely varying DC voltage.

The need for such saw-tooth-voltage generating oscillators derives mainly from the requirements of certain switching mode power supplies. Switching mode power supplies (SMPS) are basically DC to DC converters usually operating at kilohertz frequencies. Although the power efficiency of SMPS is generally much higher than that of the older linear shunt and series regulators, it is more difficult in a SMPS to obtain in the output a low value of ripple voltage. To reduce the ultrasonic ripple voltage in a SMPS, a tuned discrete filter is much less expensive and smaller than a broad band ultrasonic filter capable of effecting the same ripple reduction and so it is desirable that the oscillator frequency remain fixed It is customary for a SMPS to include an oscillator having a sawtooth output voltage.

In a SMPS incorporating the so-called feedforward feature, the rate of rise in the output ramp voltage of the oscillator is required to be kept about proportional to the input voltage. For example, the ramp slope of the oscillator output voltage is doubled for a doubling of the input voltage. This has the effect of regulating the SMPS output voltage against changes in SMPS input voltage as is further explained herein. The SMPS oscillator may in addition be required to operate at very low input voltages. The lowest voltage at which an oscillator can be made operable is called "head-room" and imposes serious limitations on the circuits that may be used to construct the oscillator, e.g. by limiting the number of $V_{BE}$ drops that the circuit places in series between the supply busses.

The design of a SMPS oscillator with a feedforward feature that will provide a stable frequency with voltage variations over such a broad range has heretofore been frustrated by the fact that circuit techniques that lead to a reliable operation at the high supply voltages to the oscillator, rule out standard techniques for operation at low supply voltages where "head-room" becomes a critical factor.

It is, therefore, an object of the present invention to provide a relaxation oscillator that has a stable frequency while operating from a widely varying supply voltage, especially for incorporation in an integrated-circuit switching mode power supply chip.

SUMMARY OF THE INVENTION

An oscillator is comprised of differentially-connected first and second NPN transistors for alternate conduction having their emitters tied together and, thence, preferably to a constant current source. First and second PNP transistors each have an emitter connected to a base of the first and second NPN transistors, respectively. A first and second current source are respectively connected to the emitters of said first and second PNP transistors to keep them in conduction.

A means is provided for connecting a capacitor to one input of the comparator located at the base of the first PNP transistor. Also provided are a constant source means for charging the capacitor and a means for applying a high reference voltage to the other input of the comparator located at the base of the first PNP transistor when the second PNP transistor is conducting (i.e. when the second NPN transistor is not conducting) and for applying a relatively low voltage at the other comparator input when the first NPN transistor is not conducting (i.e. when the second NPN transistor is conducting). A discharging means is provided for discharging the capacitor when the second NPN transistor is conducting.

Such oscillators of this invention provide excellent frequency stability when operated over a supply voltage range of from about 4 volts to 7 volts. Above about 7 volts the emitter-base junctions of the differentially-connected NPN transistors tend to break down resulting in eventual beta degradation.

By shunting these base-emitter junctions with a voltage limiting device, back voltages across these junctions may be limited by this means to substantially less than 7 volts and permit oscillator operation to much higher voltages, e.g., 25 volts, which is particularly advantageous in certain switching mode power supplies.

BRIEF DESCRIPTION OF THE DRAWING

FIG. 1 shows a simplified diagram of an oscillator of the prior art.

FIG. 2 shows a simplified diagram of an oscillator of this invention.

FIG. 3 shows a circuit diagram of an oscillator of this invention that is one which is encompassed by the simplified diagram of FIG. 2.

DESCRIPTION OF THE PREFERRED EMBODIMENT

The diagram in FIG. 1 of a saw-tooth-voltage generating oscillator of the prior art is considered here to compare and more fully appreciate oscillators of this invention. A capacitor 10 is charged by a constant current source 12 that is constant independent of voltage $V_{cc}$. Two differentially connected transistors 14 and 15 and a current source 17 that is constant for all supply voltages $V_{cc}$ form a comparator. When the capacitor voltage $E_c$ appearing at the base of transistor 15 rises to the reference voltage $E_R$ at the base of transistor 14, transistor 15 turns on and transistor 14 turns off. When the collector current in transistor 14 disappears, the circuit 19 discharges capacitor 10. At the same time when the collector current of transistor 15 appears, the circuit 21 provides at the base of transistor 14 a lower reference voltage $E_R$. During the capacitor charge period the reference voltage $E_R$ is at a high DC voltage $E_{RH}$, and is at a lower DC voltage $E_{RL}$ during the discharge period. For generating a saw-tooth voltage $E_C$, the discharge period is made much shorter than the charge period and the saw-tooth voltage $E_C$ has minimum and maximum voltages $E_{RL}$ and $E_{RH}$, respectively.

For an oscillator of this invention to be used in a SMPS circuit with the feed-forward feature, the feedforward voltage provides the supply voltage $V_{CC}$ and the oscillator capacitor charging time or ramp rate is made directly proportional to the voltage $V_{CC}$. The SMPS circuit further includes a pulse width modulator (not shown) that compares the oscillator ramp voltage to the output voltage of an error amplifier (not shown) which is a function of the load voltage.

The output of the pulse width modulator turns on an output power transistor for periods when the error amplifier voltage exceeds the oscillator ramp voltage. For example, if the valley and peak voltages of the oscillator output are 1 and 3 volts respectively, and the output of the error amplifier was 2 volts, the duty cycle would be 50%.

With feed-forward, if the line (input) voltage doubled the oscillator ramp rate would increase such that it would take half the time to reach 2 volts and thus the duty cycle would reduce to 25% effectively keeping the averaged voltage constant. Those pulse-width modulated pulses are rectified and filtered to become the SMPS output voltage. Thus, the feed-forward feature provides regulation of the SMPS output voltage against changes in line voltage.

In order to prevent changes in the oscillator output voltage $E_C$, the reference voltage $E_{RH}$ is caused to vary in proportion to the supply voltage $V_{CC}$ as is the charging current 23. However, the stability of frequency with supply voltage variations is still not good enough when the basic circuit of FIG. 1 is employed because the termination of the capacitor charging period is prolonged when transistor 15 begins to turn on, since transistor 15 draws current from current source 12 at that time and diminishes the charging current to the capacitor 10.

This problem may readily be solved by substituting a Darlington pair of NPN transistors (not illustrated) for transistor 15 to in effect raise the gain of that transistor.

However, such a solution is ruled out here since it is an objective to provide a SMPS oscillator capable of operating over a wide voltage range. The use of a Darlington pair adds one $V_{BE}$ (about 0.7 volts) to the minimum reference voltage $E_{RL}$ that can be used. PNP Darlingtons would have the same counter-productive effect, namely that it would require one more $V_{BE}$ of head room.

In the oscillator of this invention represented in FIG. 2, two PNP transistors 24 and 25 are introduced which do not add to the head room requirement and actually reduce the minimum reference voltage $E_{RL}$ that can be made operable, while at the same time providing more gain to stabilize the oscillator frequency as a function of supply voltage. The components repeated in FIG. 2 are given the same numeral designations as in FIG. 1. In FIG. 2, two current sources 28 and 29 are added to supply emitter current for the added PNP transistors 24 and 25. Current sources 28 and 29 preferably supply currents of equal value which is proportional to that of current source 17, by means of a standard interdependent current mirrors implementation of current sources 17, 28 and 29 (not illustrated).

For supply voltages $V_{CC}$ up to about 7 volts, the oscillator of FIG. 2 achieves all of the aforementioned objectives of fixed frequency and still provides a large operating spread (e.g., 2 volts) between the minimum and maximum reference voltages, $E_{RL}$ and $E_{RH}$, at the lowest power supply voltage (e.g., 4 volts). However, for power supply voltages $V_{CC}$ above about 7 to 8 volts, the base emitter junctions of the NPN transistors 14 and 15 tend to break down since $BV_{EBO}$ for integrated NPN transistors is typically 7 volts.

The oscillator circuit of FIG. 3 overcomes this limitation by the addition of two parallel back to back diodes 32 and 34 that are connected between the bases of the NPN transistors 14 and 15.

The circuit block 19 of FIG. 2 is in FIG. 3 comprised of the PNP current mirror pair 40 and 41, NPN current mirror pair 44 and 45, and the capacitor shunting transistor 47. Thus, during the capacitor charging period the collector current in transistor 14 is reflected in transistor 45 to keep the shunting transistor 47 off. When the capacitor has charged to the high reference voltage $E_{RH}$, collector current in transistor 14 goes to zero and transistor 47 turns on and discharges the capacitor 10 to the lower reference voltage $E_{RL}$.

The circuit block 21 of FIG. 2 is in FIG. 3 comprised of the supply-voltage-divider resistors 50 and 51, the series connected resistor 53 and transistor 54, resistors 56 and 57, and current mirror pair 59 and 60. Thus, during the capacitor discharge period, the collector current flowing from transistor 15 in diode 60 is reflected in the series resistors 56 and 57 holding transistor 54 on and keeping the reference voltage $E_R$ at the low value $E_{RL}$. When the capacitor voltage drops to $E_{RL}$, then transistors 15 and 54 turn off and the reference voltage $E_R$ is established at the high level $E_{RH}$ by the supply voltage $V_{CC}$ and the value of resistors 50 and 51.

It should be noted that this invention is not limited to the particular implementation of circuit blocks 19 and 21 of FIG. 2 shown in FIG. 3.

Furthermore, the purposes of blocks 19 and 21 may be accomplished by other circuits activated only by currents in transistor 14 or only by currents in transistor 15.

What is claimed is:

1. An oscillator comprising:
   a differential-transistor voltage comparator comprised of differentially-connected-for-alternate-conduction first and second NPN transistors, first and second PNP transistors each having an emitter connected to the base of said first and second NPN transistors, respectively, a first and second current source connected to said emitters of said first and second PNP transistors, respectively;
   a capacitor;
   a means for charging said capacitor
   a means for connecting said capacitor to one input of said comparator at the base of said second PNP transistor;
   a means for applying a high reference voltage at the other input of said comparator at the base of said first PNP transistor when said first NPN transistor is conducting and for applying a relatively low reference voltage at said other comparator input when said second NPN transistor is conducting; and
   a discharging means for discharging said capacitor when said second NPN transistor is conducting.

2. The oscillator of claim 1 additionally comprising a clamping circuit means for limiting the voltage excursions between said bases of said first and second NPN transistors to less than the magnitude of the characteristic reverse breakdown voltage of either base emitter junction of said NPN transistors.

3. The oscillator of claim 2 wherein said clamping circuit means is for limiting said voltage excursions to less than 7 volts.

4. The oscillator of claim 2 wherein said clamping circuit means is comprised of a first PN junction diode connected anode and cathode, respectively, between said first and second NPN transistor bases and a second PN junction diode, respectively, connected anode and cathode, respectively, between said second and first NPN transistor bases.

5. An oscillator comprising:
a pair of busses, one of said busses being adapted to be energized by a more positive DC voltage than the other of said busses;
a comparative circuit comprised of first and second NPN transistors differentially connected with their emitters tied together and connected through one current source to the other of said busses and their collectors connected to said one bus, and first and second PNP transistors having their collectors connected to said other bus and their emitters connected to the bases of said first and second NPN transistors, respectively, and two more current sources connecting said PNP emitters, respectively, to said one bus;
a series circuit comprised of a capacitor having one terminal tied to said other bus and a fourth current source connected to said one bus, the other terminal of said capacitor and said fourth current source being tied to the base of said second PNP transistor;
a discharging means for discharging said capacitor when said second NPN transistor con ducts; and
a reference voltage generating means for generating a reference voltage at the base of said first PNP transistor that has a high value when said first NPN transistor conducts and has a relatively low value when said second NPN transistor conducts.

6. The oscillator of claim 5 additionally comprising a clamping circuit means for limiting the voltage excursions between said NPN transistors to less than the characteristic reverse breakdown voltage of either base-emitter junction of said NPN transistors.

7. The oscillator of claim 6 wherein said fourth current source is for producing a current proportioned to said positive DC energizing voltage.

8. The oscillator of claim 7 wherein said reference voltage generating means is comprised of a resistive voltage divider connected across said paired busses for making said high reference voltage value proportioned to said positive DC energizing.

* * * * *